(12) United States Patent
Nakano et al.

(10) Patent No.: US 6,580,198 B2
(45) Date of Patent: Jun. 17, 2003

(54) SURFACE ACOUSTIC WAVE DEVICE HAVING A THIN METAL OXIDE FILM FULLY COVERING AT LEAST THE ELECTRODES AND METHOD OF FABRICATING SAME

(75) Inventors: Masahiro Nakano, Tokyo (JP); Michiyuki Nakazawa, Tokyo (JP); Katsuo Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/871,814

(22) Filed: Jun. 4, 2001

(65) Prior Publication Data

US 2002/0047495 A1 Apr. 25, 2002

Related U.S. Application Data

(63) Continuation of application No. PCT/JP00/02104, filed on Mar. 31, 2000.

(30) Foreign Application Priority Data

Nov. 30, 1999 (JP) .............................. 11-340757

(51) Int. Cl.$^7$ .................. H01L 41/083; H01L 41/22
(52) U.S. Cl. .............................. 310/313 R; 310/313 A; 310/364
(58) Field of Search .................. 310/313 R, 313 A, 310/364

(56) References Cited

U.S. PATENT DOCUMENTS

| 3,965,444 | A | | 6/1976 | Willingham et al. ......... 333/155 |
|---|---|---|---|---|
| 4,017,890 | A | | 4/1977 | Howard et al. .............. 257/768 |
| 5,520,751 | A | | 5/1996 | Pareek et al. ................ 148/286 |
| 5,766,379 | A | * | 6/1998 | Lanford et al. .............. 148/537 |
| 5,929,723 | A | | 7/1999 | Kimura et al. .............. 333/193 |
| 6,090,435 | A | * | 7/2000 | Ueno et al. ................... 427/79 |
| 6,316,860 | B1 | | 11/2001 | Kimura et al. .......... 310/313 A |
| 6,365,555 | B1 | * | 4/2002 | Moser et al. ................ 505/441 |

FOREIGN PATENT DOCUMENTS

| JP | 52-52585 | 4/1977 |
|---|---|---|
| JP | B 2-47866 | 10/1990 |
| JP | A 3-190311 | 8/1991 |
| JP | A 04-150512 | 5/1992 |
| JP | A 4-294625 | 10/1992 |
| JP | U 07-39118 | 7/1995 |
| JP | A 07-326942 | 12/1995 |
| JP | A 08-032399 | 2/1996 |
| JP | A 09-83288 | 3/1997 |
| JP | 9-503026 | 3/1997 |
| JP | A 09-199974 | 7/1997 |

\* cited by examiner

*Primary Examiner*—Lynn D. Feild
*Assistant Examiner*—Michael C. Zarroli
(74) *Attorney, Agent, or Firm*—Oblon, Spivak, McClelland, Maier & Neustadt, P.C.

(57) ABSTRACT

A surface acoustic wave device includes a piezoelectric substrate having Al or Al alloy electrodes formed on a surface of the substrate, a metal oxide film provided on the substrate and the electrodes. The metal oxide film is formed by a process including depositing a metal thin film having a thickness sufficiently thin so that the deposited metal thin film is discontinuous including voids, and oxidizing the discontinuous metal thin film, and the metal oxide film includes a continuous portion without voids covering the electrodes.

25 Claims, 7 Drawing Sheets

SURFACE ACOUSTIC WAVE DEVICE HAVING A THIN METAL OXIDE FILM FULLY COVERING AT LEAST THE ELECTRODES AND METHOD OF FABRICATING SAME

CROSS-REFERENCE TO RELATED APPLICATIONS

This application is a continuation of International Application No. PCT/JP00/02104, filed on Mar. 31, 2000 and Japanese Application No. 11-340757, filed on Nov. 30, 1999, and the entire content of both applications is hereby incorporated by reference.

BACKGROUND OF THE INVENTION

1. Field of the Invention

The present invention relates to a surface acoustic wave device used with portable telephones, carphones, radio equipment, etc., and a fabrication process thereof.

2. Description of the Background

Surface acoustic wave devices, i.e., surface acoustic wave filters and surface acoustic wave resonators are now increasingly used as substitute filters for dielectric filters in the high-frequency parts of portable telephones, etc. Some reasons for this are that the surface acoustic wave filters are smaller in device size than, and superior in electrical properties on the same device size basis, to dielectric filters.

A surface acoustic wave device comprises a piezoelectric substrate formed of lithium niobate, lithium tantalate or the like and various electrodes such as interdigital transducers (IDTs) and reflectors formed on the surface of the substrate. For the electrodes of the surface acoustic wave device, Al or Al alloys (e.g., Al—Cu) are ordinarily used. However, Al and Al alloys are susceptible to corrosion in a high-humidity environment, which may otherwise cause breaks in the electrodes or yield corrosion products, resulting possibly in a deterioration in filter performance. In a method used so far to prevent the deterioration in filter performance due to electrode corrosion, the electrodes are hermetically sealed up in a ceramic package to shield them against the environment.

With the method for prevention of electrode corrosion by hermetically sealing up the electrodes in the ceramic package, however, minute hermeticity breaks are likely to occur. For this reason, an additional step of inspecting the degree of hermeticity must be provided after the package is sealed. This inspection step is one factor of fabrication cost increases. In view of fabrication cost reductions, a resin package is preferable to the costly ceramic package. However, the resin package is inferior in humidity resistance to the ceramic package.

A method for prevention of IDT corrosion by covering the surface of the piezoelectric substrate having an IDT formed thereon using a thin film is also known in the art.

For instance, JP-B 3-190311 discloses a surface acoustic wave device comprising a piezoelectric substrate and a hydrophobic and insulating film of 100 Å or less in thickness, which is formed on the surface of the substrate having electrodes provided thereon. In the publication hexamethyl-disilazane, azide compounds and isocyanate compounds are referred to for the material to constitute the aforesaid film, and in one example a hexamethyl-disilazane film of 50 Å or less in thickness is formed by spray coating. However, the publication reveals that there is an insertion loss increase of 0.2 to 0.3 dB as a result of the formation of this film.

JP-A 4-294625 discloses a surface acoustic wave device wherein, in order to prevent a release and corrosion of electrode material, a protective film comprising a corrosion-resistant metal such as chromium or a dielectric material such as silicon dioxide is formed by sputtering or deposition-by-evaporation on the surface of a piezoelectric substrate having electrodes provided thereon. In one example in the publication, a chromium protective film of 100 Å in thickness is formed.

Some surface acoustic wave devices, wherein a thin film is formed on the surface of a piezoelectric substrate having electrodes provided thereon if not for the purpose of preventing electrode corrosion, are also known from the following publications.

JP-B 2-47886 discloses a process for resonant frequency control by the deposition-by-evaporation of a metal on the whole or a part of the surface of a piezoelectric substrate. In the publication, Ag, Au, Cr, Ni, etc. are referred to as the metal to be deposited by evaporation. The publication also teaches that there is no possibility of short circuits between electrode fingers because the amount of the metal to be deposited by evaporation is so small that it can be deposited in the form of discrete, fine points.

U.S. Pat. No. 3,965,444 discloses that for the purpose of compensation for temperature, an $SiO_2$ film is formed on the surface of a piezoelectric substrate having electrodes provided thereon.

JP-A 4-150512 discloses that a semi-insulating thin film is provided on the surface of a piezoelectric substrate having electrodes formed thereon. In the publication silicon oxide films, silicon oxide nitride films, silicon nitride films and silicon carbide are referred to as the material to constitute the semi-insulating thin film. By the provision of this semi-insulating thin film, static electricity generated at the piezoelectric substrate is discharged between electrodes in such a manner that any electrostatic breakdown of the device can be prevented. In one example in the publication, a silicon nitride film of about 500 Å or greater in thickness is formed as the semi-insulating film by means of a plasma CVD process.

JP-A 9-83288 discloses that in order to prevent discharge between electrodes, a semiconductor thin film is formed on the surface of a piezoelectric substrate having electrodes provided thereon, and in one example given therein an Si film of 50 nm in thickness is used as the semiconductor thin film.

JP-A 9-199974 discloses that in order to reduce noise generation due to the pyroelectric effect of a piezoelectric substrate, a resistor thin film is formed on the surface of the piezoelectric substrate having electrodes provided thereon. In the publication, a silicon thin film formed by sputtering or deposition-by-evaporation is referred to as the resistor thin film. However, the publication says nothing about the thickness of the resistor thin film.

JP-A 7-326942 discloses a surface acoustic wave device which includes an insulating film on the surface of a piezoelectric substrate having electrodes formed thereon and satisfies kh<0.15 provided that k=2π/λ, where h is the thickness of the insulating film and λ is the wavelength of a surface acoustic wave. The publication shows that the insulating film is provided for center frequency control. The publication also shows that the lower limit to kh is 0.002, and the amount of the then frequency change is about 80 ppm. In the examples in the publication, an MgO film and an $SiO_2$ film formed by sputtering are used as the insulating film.

As explained above, it is known to provide the surface of the piezoelectric substrate having electrodes formed thereon with various thin films. As shown in the aforesaid JP-B 3-190311, however, the provision of the organic film of about 100 Å in thickness causes insertion losses to become worse. As described in the aforesaid JP-A 4-294625, the formation of the Cr film of 100 Å in thickness causes short circuits to occur between electrodes, resulting in a lowering of electrical properties.

When the thin film provided on the surface of the substrate having electrodes formed thereon is a dielectric film, too, some performance deterioration, if not large as in the case of a metal film, occurs due to short circuits. For instance, as can be noted from the aforesaid JP-A 7-326942 where center frequency is controlled by the provision of the dielectric film, even the insulating film has still some influences on device performance.

SUMMARY OF THE INVENTION

In view of such situations as mentioned above, an object of the present invention is to provide a surface acoustic wave device comprising electrodes formed of Al or an Al alloy, the humidity resistance of which is improved without having any adverse influence on its electrical properties.

The aforesaid object is achievable by the following embodiments of the invention (1) A surface acoustic wave device comprising a metal oxide layer formed on a surface of a piezoelectric substrate having electrodes provided thereon, which electrodes comprise Al or an Al alloy, in such a way as to cover at least said electrodes, wherein said metal oxide layer is formed by oxidization of a metal layer having a thickness small enough to provide no continuous film.

(2) The surface acoustic wave device according to (1) above, wherein said metal oxide layer provides a continuous film at least on said electrodes.

(3) The surface acoustic wave device according to (1) or (2) above, wherein said metal oxide layer has a thickness of 0.1 to 2 nm as measured by a fluorescence X-ray thickness meter.

(4) A surface acoustic wave device comprising a metal oxide layer formed on a surface of a piezoelectric substrate having electrodes provided thereon, which electrodes comprise Al or an Al alloy, in such a way as to cover at least said electrodes, wherein said metal oxide layer has a thickness of 0.1 to 2 nm as measured by a fluorescence X-ray thickness meter.

(5) A surface acoustic wave device comprising a metal oxide layer formed on a surface of a piezoelectric substrate having electrodes provided thereon, which electrodes comprise Al or an Al alloy, in such a way as to cover at least a part of said surface of said piezoelectric substrate and said electrodes, wherein said metal oxide layer provides a continuous film on said electrodes and a discontinuous film on said surface of said piezoelectric substrate.

(6) The surface acoustic wave device according to any one of (1) to (5) above, wherein said metal oxide layer contains an oxide of a transition metal.

(7) The surface acoustic wave device according to (6) above, wherein said metal oxide layer contains a Cr oxide.

(8) A surface acoustic wave device fabrication process by forming a metal layer having a thickness small enough to provide no continuous film on a surface of a piezoelectric substrate having electrodes provided thereon, which electrodes comprise Al or an Al alloy, in such a way as to cover at least said electrodes, and then oxidizing said metal layer, thereby converting said metal layer to a metal oxide layer providing a continuous film at least on said electrodes.

(9) The surface acoustic wave device fabrication process according to (8) above, wherein said metal layer has a thickness of 0.1 to 2 nm as measured by a fluorescence X-ray thickness meter.

DETAILED DESCRIPTION OF THE PREFERRED EMBODIMENTS

Figure 1:
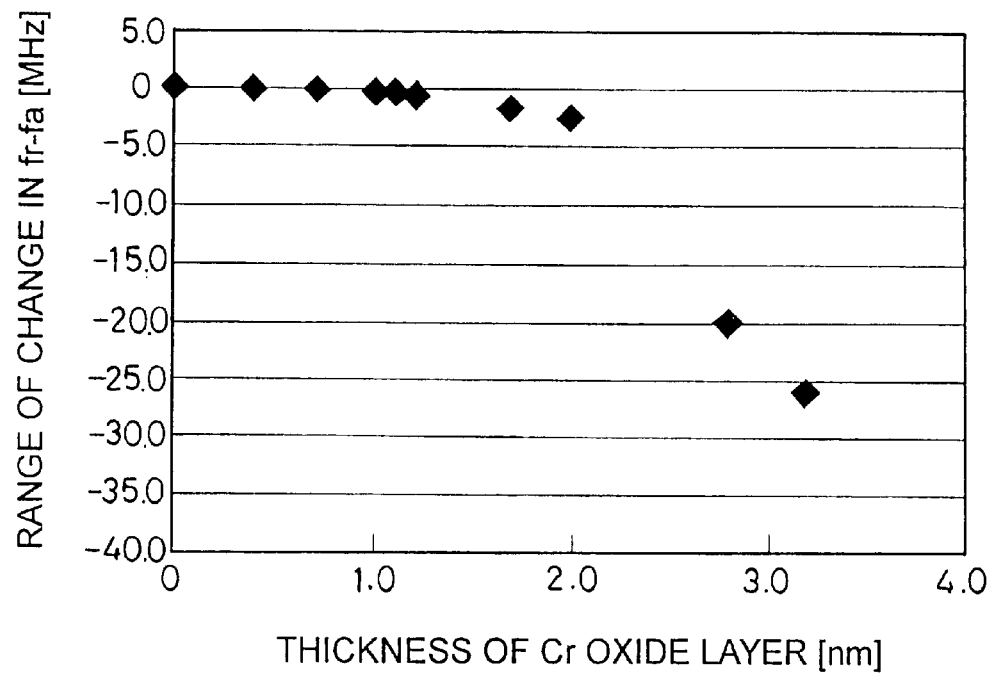
FIG. 1 is a graph illustrative of the relation between the thickness of a Cr oxide layer and the influence that the Cr oxide layer has on electrical properties.

The present invention provides a surface acoustic wave device comprising an interdigital transducer (IDT) made up of Al or an Al alloy or the IDT and a reflector electrode, wherein a metal oxide layer is provided in such a way as to cover at least the electrodes.

As explained above, a surface acoustic wave device comprising a metal oxide layer formed on the surface of a piezoelectric substrate having electrodes provided thereon is known in the art. Unlike the metal oxide layer in a conventional surface acoustic wave device, however, the metal oxide layer according to the present invention is a thin film that has no influence on the electrical properties of the surface acoustic wave device. The metal oxide layer provided to cover the surface of the piezoelectric substrate having electrodes provided thereon, when it is thick, has an adverse influence on the electrical properties of the surface acoustic wave device. For instance, a metal oxide is generally handled as an insulating material. However, an increase in the thickness of the metal oxide layer causes its electrical resistance to become low, and so causes a short circuit to occur between the electrodes. Hence, the insertion loss of the surface acoustic wave device becomes worse. In the surface acoustic wave device, for instance, a ZnO layer is often formed as a piezoelectric film between the piezoelectric substrate and the electrodes. The electrical resistance of the ZnO layer is enhanced by Li doping, etc. As a result of the first to fourth experiments, given just below, and studies thereon, the inventors have now found that if the surface of the piezoelectric substrate having electrodes provided thereon is covered with a very thin metal oxide layer, it is then possible to achieve a drastic improvement in the humidity resistance of the electrodes (the resistance of the electrodes to corrosion by humidity) without having any adverse influence on the electrical properties of the surface acoustic wave device.

A surface acoustic wave device sample used for the first experiment was prepared in the following procedure.

For the piezoelectric substrate, a 36°-rotated Y-cut lithium tantalate was used with the propagation of surface acoustic waves preset in the X direction. For electrode formation, an Al-0.5% by mass Cu alloy film of 150 nm in thickness was formed by sputtering. Then, the alloy film was configured by means of photolithography and dry etching to form an electrode pattern for a surface acoustic wave resonator having reflector electrodes on both the outsides of an IDT. This surface acoustic wave resonator has a resonant frequency of about 1.6 GHz.

Then, a metal Cr layer was formed by sputtering all over the surface of the piezoelectric substrate, on which the electrodes had been provided. Then, the assembly was thermally treated at 250° C. for 2 hours in an oxygen atmosphere to oxidize the metal Cr layer into an Cr oxide layer, thereby obtaining a surface acoustic wave device sample. For comparison, another sample was prepared in the same manner with the exception that no Cr oxide layer was provided.

Each of the samples prepared in this manner was measured for resonant frequency fr and anti-resonant frequency fa to find out the difference (fr–fa) between them. Then, the difference between the difference (fr–fa) of the sample and the reference difference (fr–fa) of the sample with no Cr oxide layer formed was found. In FIG. 1, this difference is shown as the (range of change in fr–fa). The layer thickness on the abscissa of FIG. 1 is the layer of the metal Cr layer as measured by a fluorescence X-ray thickness meter (System 3640 made by Rigaku Co., Ltd.). In FIG. 1, it is noted that the thickness of the metal Cr layer is indicated as the thickness of the Cr oxide layer because when measured by the fluorescence X-ray thickness meter, the thickness of the metal Cr layer undergoes no change by oxidization. In other words, when measured by the fluorescence X-ray thickness meter, no difference is found between the thickness of a metal layer and the thickness of a metal oxide layer formed by the oxidization of this metal, because the meter is designed to count the number of metal atoms for thickness measurement. In the present disclosure, the thicknesses of a metal layer and a metal oxide layer are all given as values measured by the fluorescence X-ray thickness meter.

Referring to FIG. 1, the closer the "range of change in fr–fa" is to zero, the more slender the influence of the Cr oxide layer on electrical properties becomes. From FIG. 1, it can thus be seen that if the thickness of the Cr oxide layer is 2 nm or less, then the Cr oxide layer has no substantial influence on the electrical properties of the surface acoustic wave device. This experimentation also teaches that if the thickness of the Cr oxide layer is 2 nm or less, there is then no change in the absolute value of impedance at fr, and fa, respectively, when compared with the case of a sample containing no Cr oxide layer. This in turn teaches that if the thickness of the Cr oxide layer is 2 nm or less, there is then no substantial short circuit due to the provision of the Cr oxide layer, with no deterioration in insertion losses.

An account is now given of the second experiment carried out to look closely at the structure of a metal oxide layer thin enough to have no influence on the electrical properties of the surface acoustic wave device.

Figure 2:
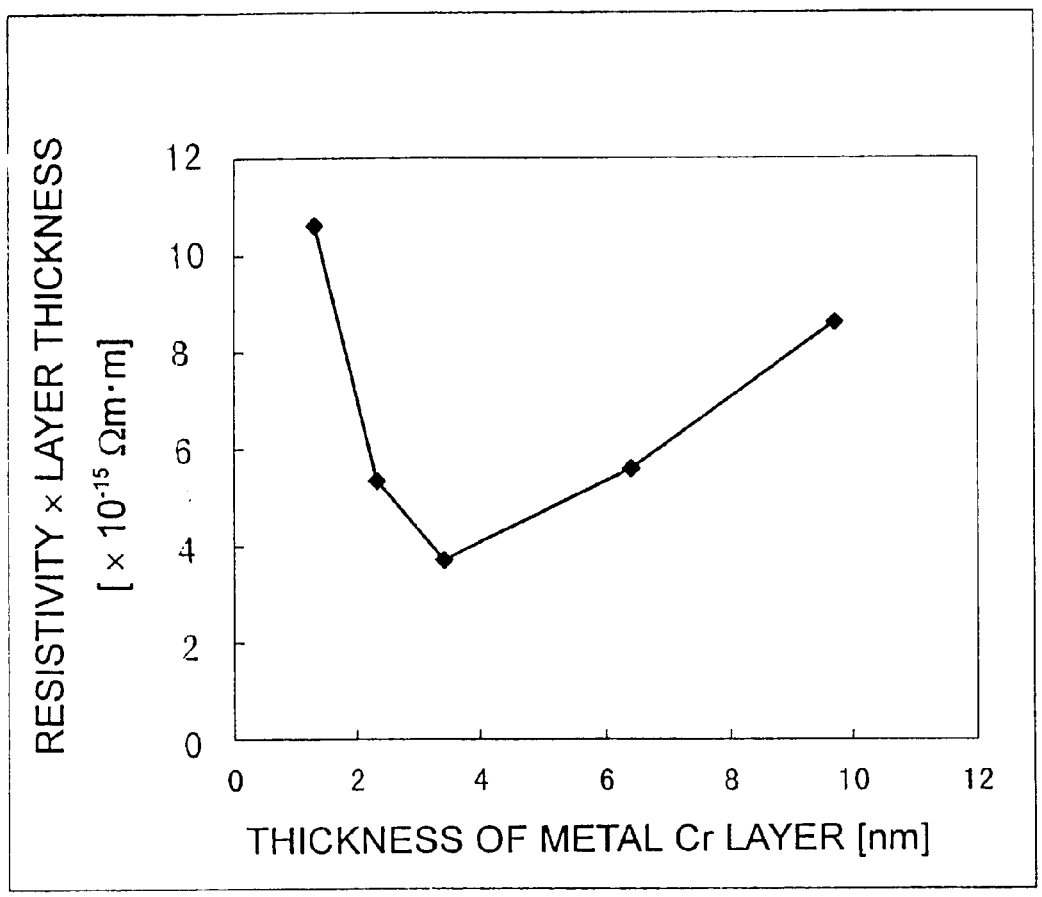
FIG. 2 is a graph illustrative of the relation between the thickness of a metal Cr layer and the "resistivity×layer thickness" in the metal Cr layer.

In the second experiment, metal Cr layers of various thicknesses were formed by sputtering on 36°-rotated Y-cut lithium tantalate substrates, as in the first experiment. The resistivity of each metal Cr layer was measured to obtain the product of the resistivity and its thickness. FIG. 2 is a graph with the thickness of the metal Cr layers as abscissa and the product of layer thickness and resistivity as ordinate.

As can be seen from FIG. 2, the product value of "resistivity x layer thickness" increases linearly with increasing layer thickness in a region where the thickness of the metal Cr layer exceeds about 3.5 nm. This reveals that the portion of the metal Cr layer in this layer thickness region retains resistivity equivalent to that of a metal Cr bulk. In other words, a substantially uniform continuous film must be formed in this layer thickness region. In another region where the thickness of the metal Cr layer is 3.5 nm or less, the product value of "resistivity x layer thickness" on the ordinate increases sharply with decreasing layer thickness. The result teaches that the resistivity of the metal Cr layer is already far away from that of the metal Cr bulk, and shows that the metal Cr layer in this thickness region is present in a discontinuous film form.

From the results illustrated in FIG. 2, it is understood that the Cr oxide layer having a thickness small enough to have no influence on the electrical properties of the surface acoustic wave device, as shown in FIG. 1, can be obtained by the oxidization of a discontinuous metal Cr layer.

An account is now given of the third experiment carried out to look specifically at the nature of the metal Cr layer and the Cr oxide layer obtained by the oxidization of the metal Cr layer.

Figure 7:
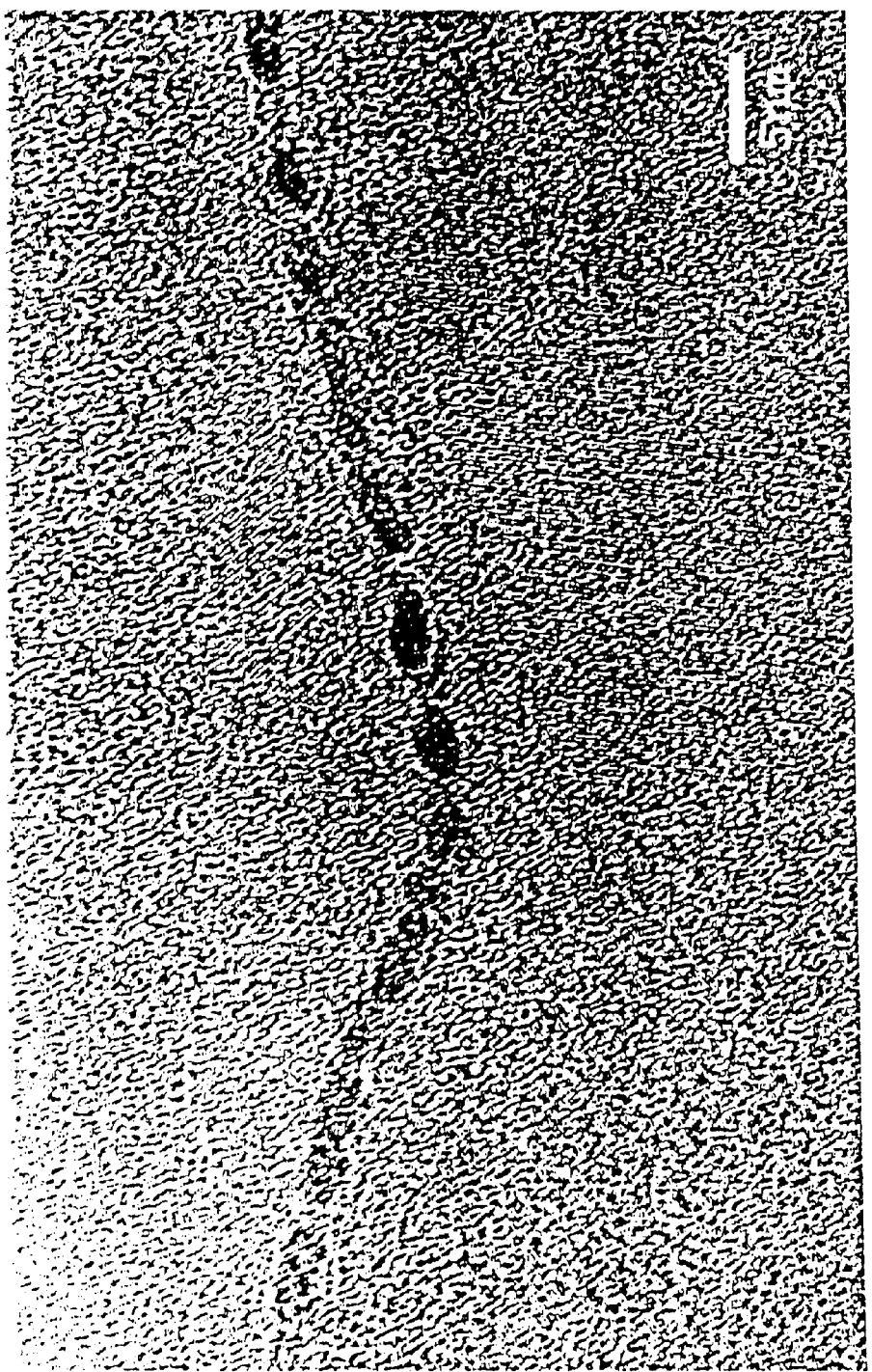
FIG. 7 is a substitute transmission electron photomicrograph for a drawing illustrative of a thin film, which photomicrograph shows a section of a metal Cr layer sandwiched between an electrode and an Al layer.

In the third experiment, the surface of a piezoelectric substrate having electrodes provided thereon was first covered with a metal Cr layer as in the first experiment with the exception that the thickness of the metal Cr layer was 0.85 nm. Then, an Al layer was provided by sputtering in such a way as to cover the metal Cr layer to prepare a sample for observation of its sectional structure. It is here noted that the Al layer was provided so as to keep the surface of the metal Cr layer in a fixed state, so that the section of the metal Cr layer could be easily observed. After the sample was cut, the metal Cr layer sandwiched between the electrodes and the Al layer was observed under a transmission electron microscope. As a result, the metal Cr layer was found to be present in a discontinuous film form, as shown in FIG. 7. In FIG. 7, the metal Cr layer is shown in a linear, dark form running through a nearly central portion of the photomicrograph.

Figure 8:
FIG. 8 is a substitute transmission electron photomicrograph for a drawing illustrative of a thin film, which photomicrograph shows a section of a Cr oxide layer sandwiched between an electrode and an Al layer.
Figure 9:
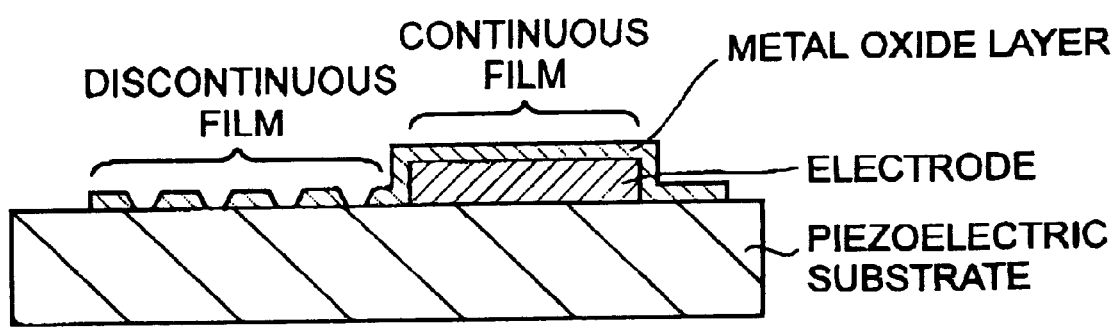
FIG. 9 illustrates the surface acoustic wave device according to an embodiment of the present invention.

After the formation of the metal Cr layer, another sample was obtained as in the case of the aforesaid sample for observation of the sectional structure with the exception that a Cr oxide layer was formed by oxidizing the metal Cr layer under the same conditions as in the first experiment. After this sample was cut, the Cr oxide layer sandwiched between the electrodes and the Al layer was observed under a transmission electron microscope. As a result, the Cr oxide layer was found to be present in a continuous film form, as shown in FIG. 8. In FIG. 8, the Cr oxide layer is shown in a linear, dark form running through a nearly central portion of the photomicrograph.

From the results of the third experiment, it is understood that by the oxidization of the metal Cr layer, the film changes from a discontinuous to a continuous form on the electrodes. Obviously, this is a leading reason for how greatly improved humidity resistance can be achieved in the present invention.

In the third experiment, whether or not the metal Cr layer on the piezoelectric substrate was changed by oxidization to a continuous film could not be checked up. From the fact that in the first experiment there was no substantial change in the electrical properties of the surface acoustic wave device having a Cr oxide layer of 2 nm or less in thickness, viz., the fact that insulation was kept between the positive and negative IDT electrodes, however, it is quite likely that the metal Cr layer on the piezoelectric substrate is still present in a discontinuous film form after oxidization.

An account is now given of the fourth experiment carried out to look closely at the effect of the Cr oxide layer as a protective layer.

In the fourth experiment, electrodes were formed on a piezoelectric substrate as in the first experiment, However, the electrode pattern used was a filter pattern with a ladder-connected surface acoustic wave resonator. This filter pattern has been designed for European Portable Telephone DCS1800 System.

Then, a metal Cr layer was formed by sputtering all over the surface of the piezoelectric substrate having electrodes formed thereon at three thicknesses, say, 0.4 nm, 0.7 nm and 1.5 nm. Finally, the metal Cr layer was oxidized as in the first experiment to obtain a surface acoustic wave device sample. For comparison, another sample was prepared as mentioned above with the exception that no Cr oxide layer was provided.

Each sample was put in a ceramic package, to which the IDT was connected by means of wire bonding. To this end, hermeticity testing was previously carried out by a bubble leakage method to sort out only packages found to have leakage. This ceramic package was let standing in a thermo-hygrostat having a temperature of 60° C. and a relative humidity of 90% for estimation of humidity-resistant life. The point to check was a change-with-time of the center frequency f0 of the surface acoustic wave filter.

Figure 3:
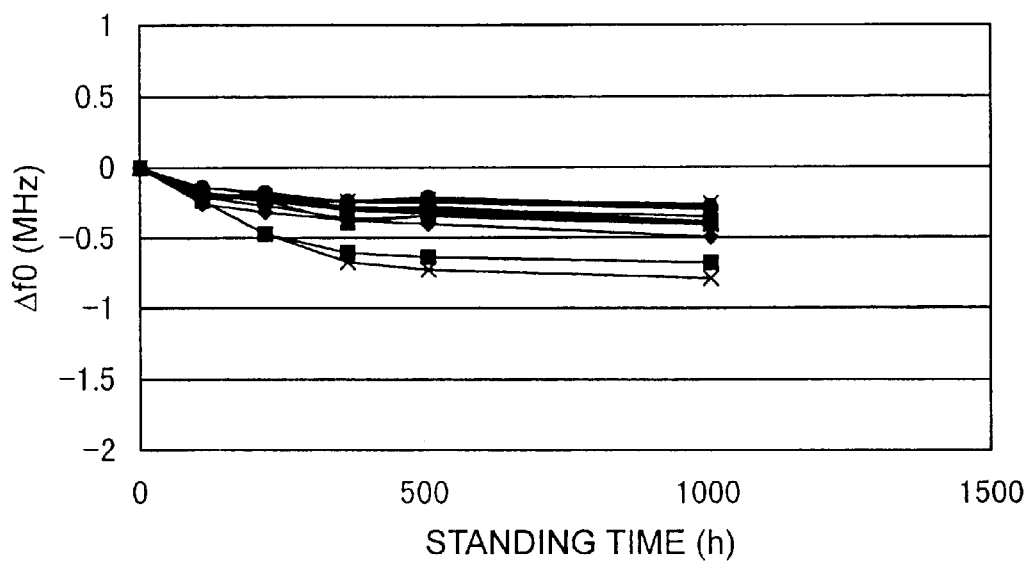
FIG. 3 is a graph illustrative of the relation between the period of time for which a surface acoustic wave device comprising a 0.4 nm thick Cr oxide layer is left standing in a high temperature and humidity environment and the amount of its center frequency change.
Figure 4:
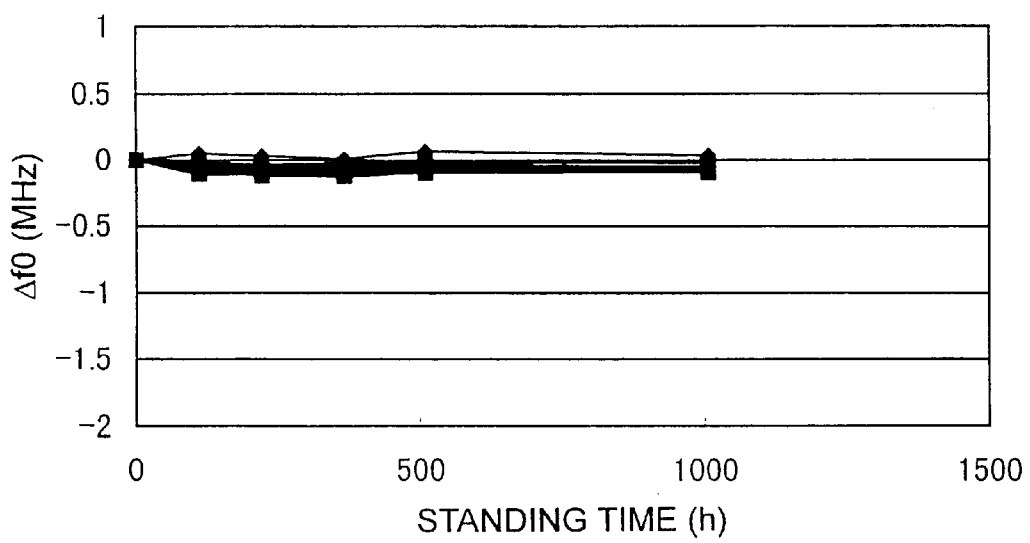
FIG. 4 is a graph illustrative of the relation between the period of time for which a surface acoustic wave device comprising a 0.7 nm thick Cr oxide layer is left standing in a high temperature and humidity environment and the amount of its center frequency change.
Figure 5:
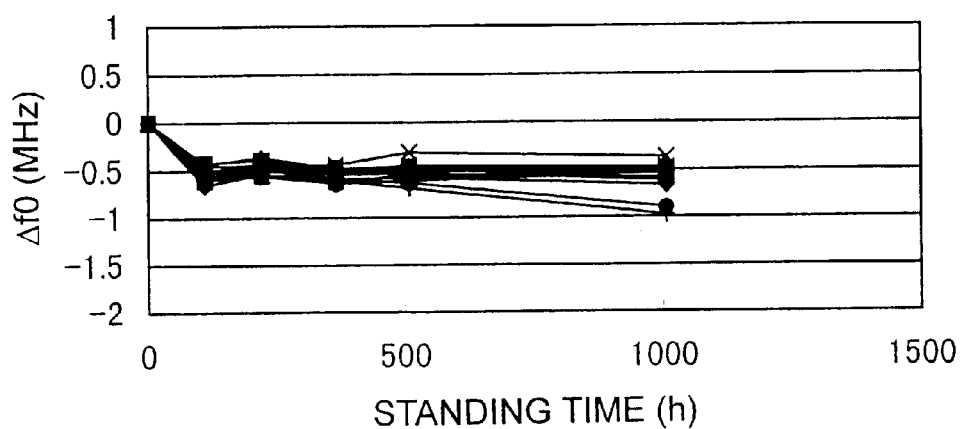
FIG. 5 is a graph illustrative of the relation between the period of time for which a surface acoustic wave device comprising a 1.5 nm thick Cr oxide layer is left standing in a high temperature and humidity environment and the amount of its center frequency change.
Figure 6:
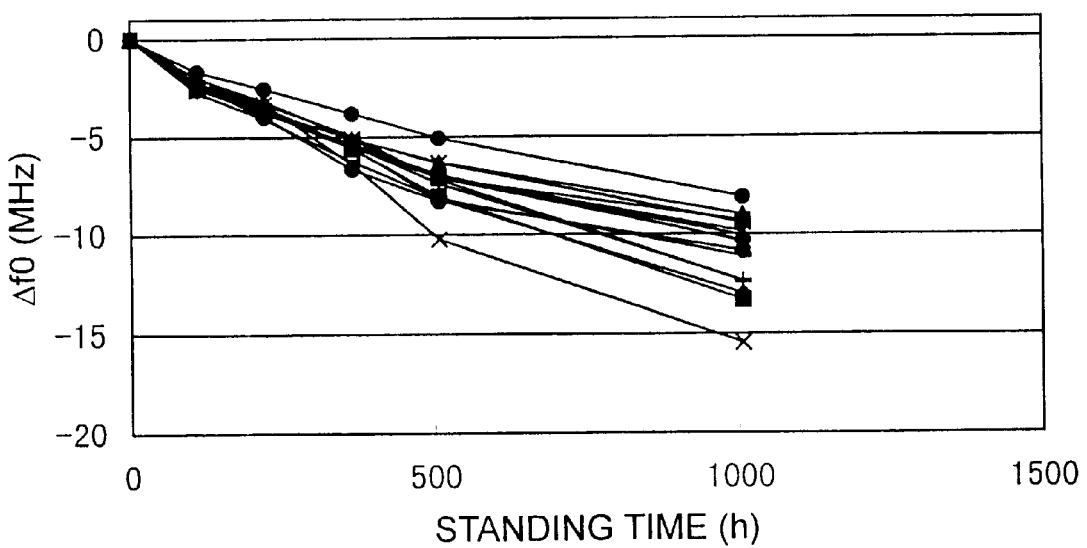
FIG. 6 is a graph illustrative of the relation between the period of time for which a surface acoustic wave device containing no Cr oxide layer is left standing in a high temperature and humidity environment and the amount of its center frequency.

The relations between the standing time and the amount of change of the center frequency, Δf0, of the respective samples are shown in FIGS. 3 to 6. FIG. 3 is illustrative of the results of samples having a 0.4 nm thick Cr oxide layer, FIG. 4 is illustrative of the results of samples having a 0.7 nm thick Cr oxide layer, FIG. 5 is illustrative of the results of samples having a 1.5 nm thick Cr oxide layer, and FIG. 6 is illustrative of the results of samples having no Cr oxide layer.

In FIGS. 3 to 5 Δf0 is limited to 1 MHz or less even after the standing time of 1,000 hours, whereas in FIG. 6 Δf0 becomes very large as represented by about 10 MHz after the standing time of 1,000 hours. It is here noted that the results of a plurality of samples are shown in each drawing, and that there are variations among these samples, because the degree of imperfectness of hermetic sealing varies from sample to sample. From FIGS. 3 to 5, it can be seen that humidity resistance is greatly improved by the present invention irrespective of the degree of imperfectness of hermetic sealing.

It is noted that the foregoing are the results of the samples having a Cr oxide layer in the thickness range of 0.4 to 1.5 nm. However, the inventors' studies show that if the metal oxide layer has a thickness of preferably 0.1 nm or greater and more preferably 0.2 nm or greater, it can then function well as a protective layer. If the metal oxide layer has a thickness of 2 nm or less as mentioned above, there is then no substantial adverse influence on electrical properties. It is thus preferable that the metal oxide layer has a thickness of 0.1 to 2 nm.

From the aforesaid results of experimentation, it can be understood that if a surface acoustic wave device is provided with a Cr oxide layer of given thickness in the form of an electrode protecting layer, it is then possible to make drastic improvements in the humidity resistance of the surface acoustic wave device without having any influence on the electrical properties thereof.

While the Cr oxide layer is used as the protective layer in the foregoing experiments, it is understood that no particular limitation is herein placed on the metal oxide used for the protective layer. However, it is preferable to use oxides of transition metals other than Al, especially Cr, Fe or Ni, or alloys containing at least one of these metals, and more especially a Cr oxide.

No particular limitation is imposed on how to form the metal oxide layer; however, it is preferable to use a method wherein a metal layer is first formed and then oxidized. For metal layer formation, vapor phase growth methods such as sputtering and deposition-by-evaporation may be used, with the sputtering method being most preferred. No particular limitation is placed on oxidization; however, it is preferable to use a method wherein the metal layer is thermally treated in an oxidizing atmosphere. For the oxidizing atmosphere, it is then preferable to use air or an atmosphere having a partial pressure of oxygen higher than does air (e.g., a pure oxygen atmosphere). The temperature and time for the thermal treatment may be appropriately determined depending on various conditions such as the partial pressure of oxygen in the treating atmosphere, and the composition of the metal layer; however, it is usually preferable to make a suitable selection from the treating temperature range of 200 to 270° C. and the treating time range of 1 to 10 hours. Too low a treating temperature or too short a treating time makes the oxidization of the metal layer likely to become insufficient, resulting in a lowering of electrical resistance between IDT-constituting electrodes and, hence, an increase in the losses of the surface acoustic wave device. On the other hand, too high a treating temperature or too long a treating time may possibly give rise to the oxidation of the IDT. In this case, too, the losses of the surface acoustic wave device increase.

Besides, according to the present invention it is also possible to form a discontinuous film form of metal oxide layer by means of a sputtering method using a metal oxide target, for instance. Preferably in this case, the metal oxide layer should have a thickness equivalent to that of the metal oxide layer obtained by the oxidization of the metal layer. However, it is noted that the metal oxide layer is not present in a continuous film form even on the electrodes, and so the effect on improvements on the humidity resistance of the electrodes becomes slender.

The metal oxide layer should preferably be formed in such a way as to cover at least the electrodes. In the present invention, however, it is not required to limit the covering range of the metal oxide layer only to the vicinity of the electrodes. The present invention is particularly effective for the case where a metal oxide layer is formed across the positive and negative IDT electrodes, because no short circuit occurs between them. For surface acoustic wave device production, a multiplicity of device patterns are first simultaneously formed on a large-area piezoelectric substrate. Thereafter, the piezoelectric substrate is cut out for each device unit to obtain a multiplicity of devices in a single operation. Thus, if the metal oxide layer is formed all over the surface of the large-area substrate having a multiplicity of device patterns provided thereon and the substrate is thereafter cut out for each device unit, it is then possible to minimize an increase in the number of steps due to the provision of the metal oxide layer. This is particularly preferable.

The present invention may be applied to any desired surface acoustic wave device wherein Al or an Al alloy is used for electrode material; that is, no particular limitation is otherwise imposed. For instance, electrode size, electrode patterns, piezoelectric substrate-constituting materials, etc. may be appropriately determined. For the Al alloy used as the electrode material, for instance, a suitable selection may be made from Al—Cu, Al—Ta, Al—Ti, Al—Sc—Cu and Al—W. In electrodes comprising Al alloys, the contents of additives incorporated in Al are generally 2% by mass or less.

According to the present invention, it is possible to make drastic improvements in the humidity resistance of a surface acoustic wave device having electrodes comprising Al or an Al alloy. It is thus possible to dispense with the step of hermeticity inspection after the device is sealed up in a package and, hence, make use of an inexpensive resin package, resulting in significant fabrication cost reductions. In addition, even when the humidity resistance of the surface acoustic wave device is improved by the present invention, there is no substantial influence on the properties of the surface acoustic wave device.

What we claim is:

1. A surface acoustic wave device, comprising:
   a piezoelectric substrate having Al or Al alloy electrodes formed on a surface of said substrate;
   a metal oxide film provided on said substrate and said electrodes, said metal oxide film formed by a process including depositing a metal thin film having a thickness sufficiently thin so that the deposited metal thin film is discontinuous including voids, and oxidizing the discontinuous metal thin film; and
   said metal oxide film comprising a continuous portion without voids covering said electrodes.

2. The surface acoustic wave device according to claim 1, wherein said metal oxide film has a thickness of 0.1 to 2 nm.

3. The surface acoustic wave device according to claim 1, wherein said metal oxide film contains an oxide of a transition metal.

4. The surface acoustic wave device according to claim 3, wherein said metal oxide film contains a Cr oxide.

5. The surface acoustic wave device according to claim 1, wherein said electrodes comprise an Al alloy comprising Al-Cu, Al-Ta, Al-Ti, Al-Sc-Cu or Al-W or a mixture thereof.

6. The surface acoustic wave device according to claim 3, wherein said metal oxide layer contains an oxide of Fe or Ni.

7. The surface acoustic wave device according to claim 5, wherein said Al alloy comprises additives, and wherein said additives are 2% by mass or less.

8. A surface acoustic wave device, comprising:
   a piezoelectric substrate having Al or Al alloy electrodes formed on a surface of said substrate;
   a metal oxide film provided on said substrate and said electrodes, said metal oxide film formed by a process including depositing a metal thin film having a thickness sufficiently thin so that the deposited metal thin film is discontinuous including voids, and oxidizing the discontinuous metal thin film; and
   said metal oxide film comprising a continuous portion without voids covering said electrodes,
   wherein said continuous portion of said metal oxide film has a thickness of approximately 0.1 to 2 nm.

9. The surface acoustic wave device according to claim 8, wherein said metal oxide film contains an oxide of a transition metal.

10. The surface acoustic wave device according to claim 9, wherein said metal oxide film contains a Cr oxide.

11. The surface acoustic wave device according to claim 8, wherein said electrodes comprise an Al alloy comprising Al-Cu, Al-Ta, Al-Ti, Al-Sc-Cu or Al-W or a mixture thereof.

12. The surface acoustic wave device according to claim 11, wherein said Al alloy comprises additives, and wherein said additives are 2% by mass or less.

13. The surface acoustic wave device according to claim 9, wherein said metal oxide layer contains an oxide of Fe or Ni.

14. A surface acoustic wave device, comprising:
    a piezoelectric substrate having Al or Al alloy electrodes formed on a surface of said substrate;
    a metal oxide film provided on said substrate and said electrodes, said metal oxide film formed by a process including depositing a metal thin film having a thickness sufficiently thin so that the deposited metal thin film is discontinuous including voids, and oxidizing the discontinuous metal thin film; and
    said metal oxide film comprising a continuous portion without voids covering said electrodes, and a discontinuous portion including voids provided on said surface of said piezoelectric substrate.

15. The surface acoustic wave device according to claim 14, wherein said metal oxide film contains an oxide of a transition metal.

16. The surface acoustic wave device according to claim 15, wherein said metal oxide film contains a Cr oxide.

17. The surface acoustic wave device according to claim 14, wherein said electrodes comprise an Al alloy comprising Al-Cu, Al-Ta, Al-Ti, Al-Sc-Cu or Al-W or a mixture thereof.

18. The surface acoustic wave device according to claim 17, wherein said Al alloy comprises additives, and wherein said additives are 2% by mass or less.

19. A process for forming a surface acoustic wave device, comprising:
    forming, on a surface of a piezoelectric substrate having Al or Al alloy electrodes provided thereon, a metal oxide film, comprising,
    depositing a metal thin film having a thickness sufficiently thin so that the deposited metal thin film is discontinuous including voids, and
    oxidizing the discontinuous metal thin film, said metal oxide film comprising a continuous portion without voids covering at least said electrodes.

20. The process according to claim 19, wherein said metal layer has a thickness of 0.1 to 2 nm as measured by a fluorescence X-ray thickness meter.

21. The process according to claim 19, wherein said electrodes comprise an Al alloy comprising Al-Cu, Al-Ta, Al-Ti, Al-Sc-Cu or Al-W or a mixture thereof.

22. The process according to claim 21, wherein said forming step comprises forming a metal alloy thin film comprising said metal and additives of 2% by mass or less.

23. The process according to claim 19, wherein said metal oxide layer contains an oxide of a transition metal.

24. The process according to claim 23, wherein said metal oxide contains a Cr oxide.

25. The process according to claim 23, wherein said metal oxide layer contains an oxide of Fe or Ni.

* * * * *